US008815766B2

(12) United States Patent
Lu et al.

(10) Patent No.: US 8,815,766 B2
(45) Date of Patent: Aug. 26, 2014

(54) METAL CONTAINING COMPOSITES

(75) Inventors: Junling Lu, Evanston, IL (US); Peter C. Stair, Northbrook, IL (US)

(73) Assignee: Northwestern University, Evanston, IL (US)

( * ) Notice: Subject to any disclaimer, the term of this patent is extended or adjusted under 35 U.S.C. 154(b) by 83 days.

(21) Appl. No.: 13/394,881

(22) PCT Filed: Jun. 11, 2010

(86) PCT No.: PCT/US2010/001689
§ 371 (c)(1),
(2), (4) Date: Mar. 8, 2012

(87) PCT Pub. No.: WO2011/031288
PCT Pub. Date: Mar. 17, 2011

(65) Prior Publication Data
US 2012/0172211 A1 Jul. 5, 2012

Related U.S. Application Data

(60) Provisional application No. 61/276,260, filed on Sep. 10, 2009.

(51) Int. Cl.
B01J 21/00 (2006.01)

(52) U.S. Cl.
USPC .......................................... 502/240; 977/778

(58) Field of Classification Search
None
See application file for complete search history.

(56) References Cited

U.S. PATENT DOCUMENTS

| 6,197,720 B1 | 3/2001 | Heineke et al. |
| 2003/0201541 A1 | 10/2003 | Kim |
| 2004/0203254 A1 | 10/2004 | Conley et al. |
| 2009/0233790 A1* | 9/2009 | Vajda et al. .................. 502/334 |

FOREIGN PATENT DOCUMENTS

| CN | 1972880 | 5/2007 |
| GB | 2455993 | 7/2009 |

OTHER PUBLICATIONS

Groner et al (Low-Temperature Al2O3 Atomic Layer Deposition, Chem Mater. 2004, 16, 639-645).*
Silvennoinen et al (Supported iridium catalysts prepared by atomic layer deposition: effect of reduction and calcination on activity in toluene hydrogenation, Catalysis Letters, 2007, vol. 114, No. 3-4, 135-144).*
Elam et al (Nucleation and Growth of Noble Metals on Oxide Surfaces Using Atomic Layer Deposition, The Electrochemical Society, ECS Transactions, 3(15), 2007, 271-278).*
Lopez, et al. "Spectroscopic Characterization and Catalytic Properties of Sol-gel Pd/SiO2 Catalysts", Journal of Catalysis, No. 138, 1992, 463-473.

(Continued)

Primary Examiner — Patricia L Hailey
Assistant Examiner — Michael Forrest
(74) Attorney, Agent, or Firm — Brooks, Cameron & Huebsch, PLLC

(57) ABSTRACT

Embodiments include metal (102) containing composites (100) and methods of forming metal containing composites. A metal containing composite can be formed by contacting an oxide support surface (104) with coordination compounds having metal atoms for a first predetermined time, where the metal atoms of the coordination compounds deposit on the oxide support surface; contacting the oxide support surface with a first reagent for a second predetermined time; and contacting the first reagent with a second reagent for a third predetermined time, where the first reagent and the second reagent react to form another layer of the oxide support surface.

7 Claims, 6 Drawing Sheets

(56) References Cited

OTHER PUBLICATIONS

Elam, et al. "Atomic layer deposition of palladium films on Al2O3 surfaces", Thin Solid Films, No. 515, 2006, 1664-1673.

Elam, et al. "Viscous Flow Reactor with Quartz Crystal Microbalance for Thin Film Growth by Atomic Layer Deposition", Review of Scientific Instruments, vol. 73, No. 8, Aug. 2002, 2981-2987.

King, et al. "Ultralow Loading Pt Nanocatalysts Prepared by Atomic Layer Deposition on Carbon Aerogels", Lawrence Livermore National Laboratory, Nanoletters, LLNL-JRNL-403291, Apr. 29, 2008, 14 pages. Also published as: Nano Lett., 2008, 8 (8), pp. 2405-2409. DOI: 10.1021/nl801299z. Publication Date (Web): Jul. 18, 2008. American Chemical Society.

Elam, et al. "Nucleation and Growth of Noble Metals on Oxide Surfaces Using Atomic Layer Deposition", XP008110010, The Electrochemical Society, ECS Transactions, 3 (15), 2007, 271-278.

Jaeger, et al. "Growth Characteristics of Au/SiO2 Nanocomposites", XP002599333, Mat. Res. Soc. Symp. Proc., vol. 549, 1999, 173-178.

International Search Report and Written Opinion from related PCT application PCT/US2010/001689 dated Sep. 21, 2010, 15 pages.

International Preliminary Report on Patentability from related PCT application PCT/US2010/001689 dated Nov. 11, 2011, 16 pages.

R.J. Silvennoinen, et al., Catalysis Letters, vol. 114 Nos. 3-4 Apr. 2007; Supported iridium catalysts prepared by atomic layer deposition: effect of reduction and calcination on activity in toluene hydrogenation, (10 pgs).

Stefan Vajda, et al., Nature Materials, Feb. 2009, Subnanometre platinum clusters as highly active and selective catalysts for the oxidative dehydrogenation of propane, (27 pgs).

\* cited by examiner

METAL CONTAINING COMPOSITES

This application is a National Stage application under 35 U.S.C. 371 of PCT/US2010/001689, filed on Jun. 11, 2010 and published as WO 2011/031288 A1 on Mar. 17, 2011, which claims the benefit of U.S. Provisional Application Ser. No. 61/276,260 filed Sep. 10, 2009, the entire contents of which are incorporated herein by reference in its entirety.

This disclosure relates to metal containing composites and methods of forming metal containing composites, and in particular metal containing composites formed with atomic layer deposition (ALD).

Metal clusters having dimensions and size distributions useful for catalysts can be difficult to prepare. Sometimes this can be particularly difficult when attempting to deposit the metal clusters on high surface area substrates, which are necessary to support some catalysts.

Catalysts having metal clusters have been prepared by a variety of methods. The methods have been described in a number of reviews and include chemical vapor deposition (CVD) processes as well as impregnation processes. In a CVD process, a desired precursor compound, or compounds, is vaporized and then introduced into a deposition chamber containing a heated substrate in a single deposition cycle. The vaporized precursors then contact reaction gas at the substrate surface to form the metal clusters. The contacting is continued for a period of time until the desired thickness of the layer is achieved.

In an impregnation process, metal clusters are formed by aqueous metal salt deposition onto a support followed by reduction at high temperature or by colloidal synthesis and then grafted to a support. In metal salt deposition the control of particle size is poor. Colloidal synthesis is used to control the size and size distribution of the metal clusters. Colloidal synthesis uses protective ligands to help control the size and the size distribution of the metal clusters. However, in colloidal synthesis based processes of catalyst preparation the metal clusters must still be grafted onto the support while trying to prevent metal agglomeration, which can result in less effective catalyst. In an effort to prevent metal agglomeration, metal clusters fabricated via the colloidal synthesis are coated with one or more mono-layers of stabilizing agents, such as polymers. However, the coating layers must be removed in order to be used for catalysis.

Figure 1:
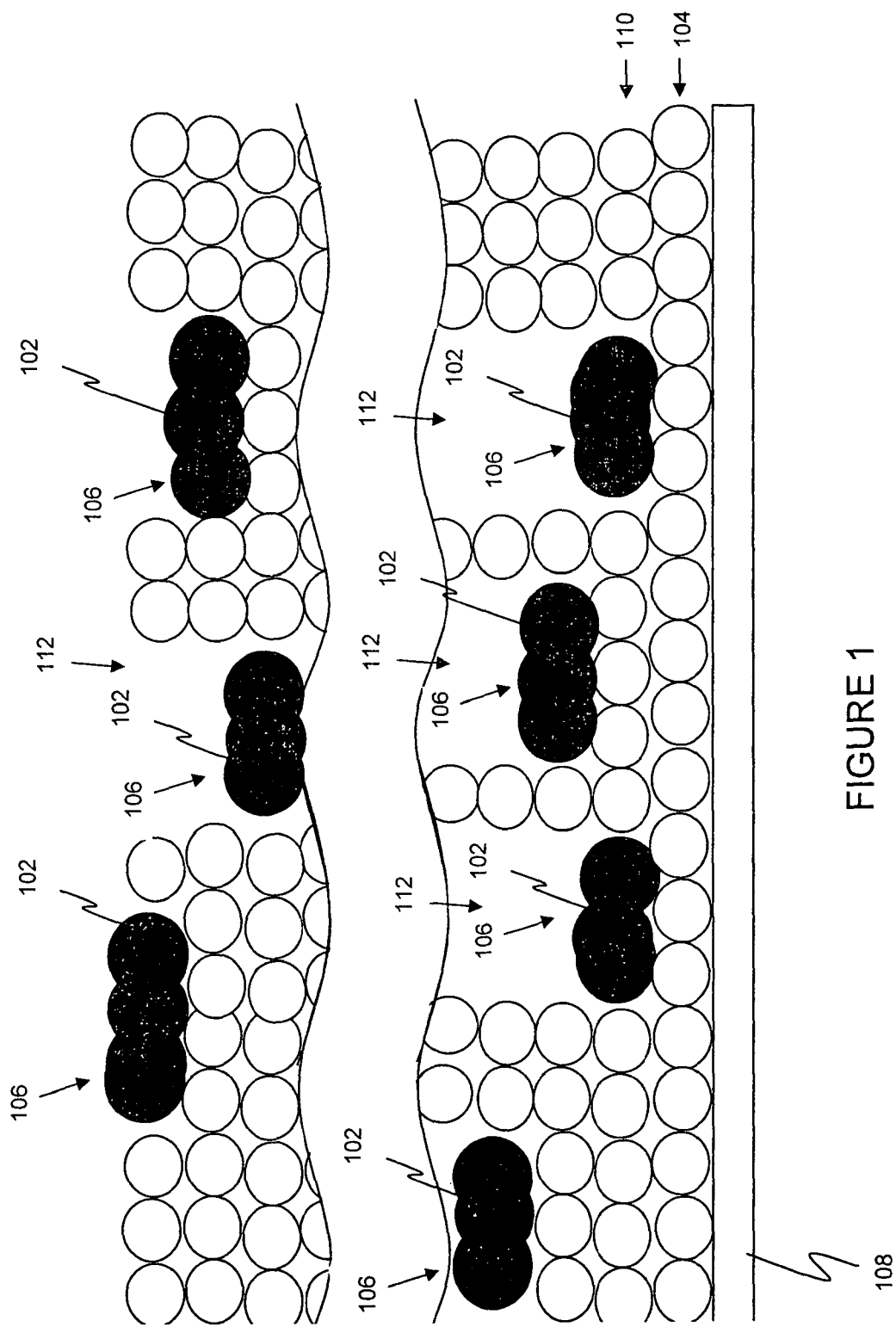
FIG. 1 illustrates cross sectional portions of a metal containing composite.

"Coordination compound" refers to a compound formed by the union of a metal ion with a nonmetallic ion, molecule, or atom.

"Ligand" refers to a nonmetallic ion, molecule, or atom that is attached to a central atom of a coordination compound.

"Composite" refers to a mixture of two or more chemically bonded materials that are solid in the finished state, are mutually insoluble, and differ in chemical nature.

"Metal containing composite" refers to a composite including metal, e.g. metal atoms.

"Mixture" refers to a heterogeneous association of substances that may, or may not, be uniformly dispersed.

"Substrate" refers to a base and/or a support.

"Layer" refers to a coating. A layer can be a substrate and/or can be formed on a substrate or on another layer. A layer can be formed from the compounds of the present disclosure using an ALD process. Theoretically, an ALD cycle forms a layer that is uniformly one atom or molecule thick on an exposed surface. However, the layer may not occur on all portions of the exposed surface. Such a partial layer is understood to be a layer herein.

"Deposition", "deposition process" and "vapor deposition process" refer to a process in which a layer is formed on one or more surfaces of a substrate and/or a layer.

"Atomic layer deposition" (ALD) is also meant to include the related terms "atomic layer epitaxy" (ALE), molecular beam epitaxy (MBE), gas source MBE, organometallic MBE, and chemical beam epitaxy when performed with alternating pulses of chemical components.

"Particle" refers to any discrete unit of material structure, where the discrete units are comprised of atoms, molecules, or combinations thereof.

The metal containing composites include a plurality of oxide support surfaces and a plurality of metal particles, e.g. palladium, deposited on one or more of the oxide support surfaces, where the metal particles have an average particle size of 1 nanometer (nm) and 80 percent of the metal particles have a particle size within 0.2 nm of the average particle size.

A method of forming a metal containing composite includes performing a plurality of ALD cycles to form the metal containing composite, where one or more of the ALD cycles include sequentially contacting an oxide support surface with coordination compounds having metal atoms for a first predetermined time, contacting the oxide support surface with a first reagent that is inert to the coordination compounds for a second predetermined time, and contacting the first reagent with a second reagent that is inert to the coordination compounds for a third predetermined time, where the first reagent and the second reagent react at a temperature within a range of from 20 degrees Celsius (° C.) to 300° C. to form another layer of the oxide support surface.

Metal containing composite 100 includes metal atoms 102 that are chemically bonded to an oxide support surface 104. Metal atoms 102 are deposited on oxide support surface 104 to form metal particles 106. Metal particles 106 can be formed of different numbers and/or compositions of metal atoms 102. For example, metal particles 106 can be formed of one, two, three, four, or even more of the metal atoms 102, where each of the metal atoms 102 is the same or different elements.

Metal containing composite 100 can include a substrate 108 which supports oxide support surface 104 and metal particles 106. Oxide support surface 104 is chemically bonded to substrate 108 and/or another layer of oxide support surface 104.

Metal containing composite 100 is useful as a catalyst for a chemical reaction between reactants. Metal containing composite 100 can include interstices 112 that are highly tortuous and/or porous, which are formed from oxide support surface 104. Along portions of interstices 112 are metal particles 106, which can act as the catalyst. One or more of the reactants can diffuse onto and/or through interstices 112 where they can adsorb onto metal particles 106. Metal particles 106 can provide an activation site for the catalytic reaction. Metal containing composite 100 is useful in a sensor, where metal particles 106 react with and/or provide a reaction site for one or more compounds to be sensed and/or detected.

Metal containing composite 100 is formed by performing a plurality of ALD cycles. Unlike CVD, ALD is a multiple cycle vapor deposition process in which vapors generated during each cycle can be sequentially directed to and/or sequentially contacted with a surface to form a metal containing layer on the surface by deposition. ALD is advantageous because it can provide improved control of atomic level thickness and uniformity to the deposited layers.

Metal containing composite 100 is formed of sequential layers of oxide support surface 104 and metal atoms 102 deposited thereon via ALD. Surprisingly, deposition of each of the layers of metal containing composite 100 provides a consistently uniform layer growth rate for both oxide support surface 104 and the deposited metal atoms 102, which form metal particles 106. There is an essentially constant growth rate of metal containing composite 100 for each of the ALD cycles used in forming metal containing composite 100; the essentially constant growth rate is observed for both a mass of metal atoms 102 deposited and a mass of oxide support surface 104 gained.

Additionally surprising is that the plurality of metal particles 106 can be controlled to have an average particle size of 1 nanometer (nm) and that 80 percent of the metal particles 106 have a particle size within 0.2 nm of the average particle size, e.g., when the metal atoms 102 are palladium (Pd) and the oxide support surface 104 is alumina. This is found to be particularly advantageous for use as a catalyst. Other particle sizes and particle size distributions can be achieved by chemically varying metal atoms 102 and/or oxide support surface 104. Metal containing composite 100 can be formed at temperatures that are below the temperatures at which some other catalysts are formed by CVD or ALD employing alternate applications of a metal-containing vapor and a reducing agent in a ABAB ... sequential fashion, which can lower production costs as compared to production costs associated with forming some other catalysts.

The ALD is performed in a viscous flow reactor system as discussed in J. W. Elam, M. D. Groner and S. M. George, "Viscous Flow Reactor with Quartz Crystal Microbalance for Thin Film Growth by Atomic Layer Deposition", Rev. Sci. Instrum. 73, 2981-2987 (2002), which is herein incorporated by reference. Other ALD systems are also suitable for embodiments of this disclosure. The ALD system maintains a temperature within a range of from 20° C. to 425° C.

Oxide support surface 104 can be formed on substrate 108 by ALD, as described herein. It may be desirable to provide substrate 108 having a preformed oxide support surface 104 thereon. Substrate 108 and oxide support surface 104 can have the same chemical composition or different chemical compositions. For some embodiments, substrate 108 is oxide support surface 104. A suitable oxide support surface 104 can include, but is not limited to, aluminum oxide, titanium dioxide, silicon dioxide, niobium oxide, copper oxide, iron oxide, zinc oxide, cerium oxide, magnesium oxide, zirconium oxide, and combinations thereof. A suitable substrate 108 can include, but is not limited to, silicon, glass, metals, polymers, porous host matrices (aerogels, silica gel, mesoporous silica), nitride, sulfide, carbon, nanowires, oxides, and combinations thereof.

For ALD, vapors used to form subsequent layers of metal containing composite 100 are sequentially pulsed into a reactor of the ALD system. "Vapors" include volatile and/or high vapor pressure liquids.

One or more ALD cycles include sequentially contacting oxide support surface 104 with coordination compounds having metal atoms 102 for a first predetermined time, contacting oxide support surface 104 with a first reagent that is inert to the coordination compounds for a second predetermined time, and contacting the first reagent with a second reagent that is inert to the coordination compounds for a third predetermined time, where the first reagent and the second reagent react at a temperature within a range of from 20° C. to 300° C. to form another layer of oxide support surface 104. Metal atoms 102 deposit on oxide support surface 104 to form metal particles 106.

The coordination compounds include metal atoms 102 and a number of ligands. Metal atoms 102 chemically bond to oxide support surface 104 when the coordination compounds contact oxide support surface 104. The chemical bonding occurs due, in part, to a dissociation of at least a portion of the ligands from the coordination compounds.

Some ligand remains bonded to metal atoms 102 after deposition onto oxide support surface 104. This helps prevent undesired growth of metal particles 106 and helps provide metal particle 106 size and/or metal particle 106 size distribution, as discussed herein.

Metal atoms 102 are selected from the group consisting of palladium, platinum, rhodium, iridium, ruthenium, rhenium, gold, silver, copper, and combinations thereof. The coordination compounds are selected from the group consisting of palladium (II) acetylacetonate, palladium (II) hexafluoroacetylacetonate, bis(2,2,6,6-tetramethyl-3,5-heptanedionato) palladium, cyclopentadienyls, substituted pentadienyl precursors and beta diketonates, such as platinum (II) acetylacetonate, platinum (II) hexafluoroacetylacetonate, (trimethyl)cyclopentadienylplatinum (IV), (trimethyl)methylcyclopentadienylplatinum (IV), tris(2,2,6,6-tetramethyl-3,5-heptanedionato)platinum, rhodium (III) acetylacetonate, rhodium (III)hexafluoroacetylacetonate, tris(2,2,6,6-tetramethyl-3,5-heptanedionato) rhodium, bis(cyclopentadienyl) ruthenium, bis(ethylcyclopentadienyl)ruthenium (II), bis (pentamethylcyclopentadienyl)ruthenium, ruthenium (III) acetylacetonate, ruthenium (III) hexafluoroacetylacetonate, tris(2,2,6,6-tetramethyl-3,5-heptanedionato) ruthenium (III), iridium (III) acetylacetonate, iridium (III) hexafluoroacetylacetonate, tris(2,2,6,6-tetramethyl-3,5-heptanedionato)iridium, (methylcyclopentadienyl)(1,5-cyclooctadiene)iridium (I), and combinations thereof.

For some applications the coordination compounds contact oxide support surface 104 for a first predetermined time within a range of from 1 second to 300 seconds. However, embodiments are not limited to this range and other first predetermined times are possible.

The first reagent contacts oxide support surface 104 for a second predetermined time within a range of from 1 second to 300 seconds and forms a first reagent layer on portions of oxide support surface 104 that are exposed. However, embodiments are not limited to this range and other second predetermined times are possible. Portions of oxide support surface 104 that are at and/or near metal atoms 102 that are deposited on oxide support surface 104 and have remaining ligand are not exposed and will not form the first reagent layer and the first reagent layer will not form on those metal atoms 102.

The first reagent is inert to the coordination compounds. The first reagent is selected from the group consisting of $Al(R^1)_3$, $Ti(R^2)_4$, bis(cyclopentadienyl)magnesium, iron(III) tert-butoxide, $Zn(R^3)_2$, and combinations thereof, where each $R^1$ is independently methyl, ethyl, propyl, or hydroxide, each $R^2$ is independently ethoxide, iso-propoxide, chloride, iodide, or benzyl, and each $R^3$ is independently ethyl, propyl, butyl, pentyl, hexyl, methoxide, or ethoxide.

A second reagent contacts the first reagent and/or oxide support surface 104 for a third predetermined time within a range of from 1 second to 300 seconds and forms another layer 110 of oxide support surface 104 when the first reagent and the second reagent react at a temperature within a range of from 20° C. to 300° C. However, embodiments are not limited to this range and other third predetermined times are possible. Sometimes the first reagent and the second reagent react in a temperature within a range of from 30° C. to 200° C., or in a temperature within a range of from 50° C. to 150° C.

Another layer 110 of oxide support surface 104 will not form at and/or near portions of oxide support surface 104 where metal atoms 102 are deposited on oxide support surface 104 and have remaining ligand, or on those metal atoms 102.

The second reagent is inert to the coordination compounds. The second reagent is selected from the group consisting of water, ethylene glycol, formalin, ammonia, hydrogen sulfide, hydrogen peroxide, nitrous oxide, nitrogen dioxide, phosphine, arsine, and combinations thereof.

Another layer 110 of oxide support surface 104 has the same chemical composition or a different chemical composition than subsequent and/or prior layers of oxide support surface 104. For example, both a layer of oxide support surface 104 and another layer 110 may be alumina, or a layer of oxide support surface 104 can be alumina while another layer 110 is titania. Likewise, a layer of oxide support surface 104 of metal containing composite 100 has a chemical composition that is the same as or is different than some other layer of oxide support surface 104.

Each ALD cycle can be performed a plurality of times, which is more than one. The plurality of ALD cycles can be performed different numbers of times for various applications. While a number of ALD cycles can be performed, cost considerations, rather than mechanical or chemical limitations, may contribute to determining the number of cycles for particular applications. Additionally, each ALD cycle can be identical to or different than a previous and/or subsequent ALD cycle.

For example, contacting oxide support surface 104 with the coordination compounds having metal atoms 102 for a first predetermined time can be considered as a first element, e.g., element A, of an ALD cycle. Contacting oxide support surface 104 with the first reagent that is inert to the coordination compounds for a second predetermined time can be considered as a second element, e.g., element B, of an ALD cycle. Contacting the first reagent with a second reagent that is inert to the coordination compounds for a third predetermined time, where the first reagent and the second reagent react at a temperature within a range of from 20° C. to 300° C. to form another layer 122 of the oxide support surface 104, can be considered as a third element, e.g., element C, of an ALD cycle.

In the above example, the ALD cycle can include element A being performed before element B, and element B being performed before element C. The elements A, B, and C can be performed in a sequential, repetitive manner. However, an ALD cycle can be performed in other sequential manners that may or may not be repetitive. In additional embodiments, the ALD cycle can be performed in a sequential manner of ABCBCBCABCBCBC . . . , where one A occurs for every n (an integer, e.g. 3) repeated pairs of BC. In one or more embodiments, a subsequent ALD cycle includes more elements than a previous ALD cycle. For example, the subsequent ALD cycle can include additional elements D, E, and so forth, while a previous ALD cycle includes ALD cycle elements A, B, and/or C. In one or more embodiments, a subsequent ALD cycle includes fewer elements than a previous ALD cycle.

The ligand that remains bonded to metal atoms 102 after the metal atoms 102 have deposited on oxide support surface 104 can be removed from metal atoms 102, metal particles 106, and/or metal containing composite 100 by calcining and/or reducing.

Calcining, also referred to as calcination, is the heating of a solid to a temperature below its melting point that brings about a thermal decomposition and/or dissociation. Calcining can occur in the presence of a non-reducing gas at a temperature within a range of from 80° C. to 600° C. For some applications calcining occurs in at a temperature within a range of from 200° C. to 500° C., or within a range of from 300° C. to 450° C. Suitable non-reducing gasses include, but are not limited to, helium, nitrogen, argon, neon, oxygen, ozone, dry air, and combinations thereof. Calcining can be performed in the ALD system or in a separate reactor, where the separate reactor produces and maintains the calcination conditions as discussed herein.

Reduction can occur in the presence of hydrogen, hydrocarbons, carbon monoxide, formalin, and combinations thereof Reduction can occur at a temperature within a range of from 80° C. to 600° C. For some applications reduction occurs at a temperature within a range of from 150° C. to 500° C., or within a range of from 300° C. to 450° C. The reduction temperature is, in part, a function of the components used in forming metal containing composite 100.

Calcination and/or reduction provide that metal containing composite 100 is useful as a catalyst due to ligand removal, as discussed herein. Metal containing composite 100 is useful as a heterogeneous catalyst, where gas phase and/or liquid phase reactants contact metal particles 106 of metal containing composite 100. The removal of ligand helps provide that metal containing composite 100 has an intricate three dimensional structure having numerous interstices 112, which are tortuous pathways throughout metal containing composite 100. Interstices 112 help to increase the surface area of metal particles 106 that can contact the gas phase and/or liquid phase reactants. The metal particle 106 size and size distribution, as discussed herein, helps provide an increased exposed surface area of metal atoms 102 per given mass of metal containing composite 100, as compared to some other catalysts having a relatively larger metal particle size.

EXAMPLES

Materials include trimethylaluminum, $(CH_3)_3Al$, (TMA), assay 97%, (Sigma-Aldrich®), titanium(IV) isopropoxide, $Ti[OCH(CH_3)_2]_4$, (TTIP), assay 97%, (Sigma-Aldrich®), ultrapure water (Millipore™), palladium(II) hexafluoroacetylacetonate, $Pd(C_5HF_6O_2)_2$, (Sigma-Aldrich®), silica gel S10040M, (SiliCycle®), inert gas: nitrogen, viscous flow reactor system (J. W. Elam and as discussed herein). Mount quartz crystal microbalance (Maxtek Inc.), having thickness monitor model TM-400R and QCM sensors CCAT1BK-1007-000 (Colorado Crystal Corporation), in Maxtek BSH-150 bakeable sensor (INFICON) housing and seal with Epotek P1011 epoxy (Epoxy Technology, Inc.) Operate the reactor at a pressure of 1 Torr with the nitrogen flow at 360 standard cubic centimeters per minute (sccm). Monitor pressure by a 10 Torr Baratron capacitance manometer to maintain flow velocity of 2.5 meters/second.

Ex. 1

Sequentially expose microbalance surface to TMA and ultrapure water at 80° C. for one hundred ten cycles. Each cycle includes a 2 second (s) TMA exposure, and a 2 s ultrapure water exposure, and follow each exposure by a 5 s inert gas purge. There is an approximately 10 nanometer (nm) thick alumina coating on the surface after the cycles.

Sequentially expose the coated surface to thirty four ALD cycles including $Pd(C_5HF_6O_2)_2$, TMA, and ultrapure water at 80° C. Each ALD cycle includes a 5 s $Pd(C_5HF_6O_2)_2$ exposure, a 2 s TMA exposure, and a 5 s ultrapure water exposure, and follow each exposure by a 10 s inert gas purge.

Table 1 shows the Pd compound ($Pd(C_5HF_6O_2)$), the alumina, and the total mass gains for particular ALD cycles.

TABLE 1

| ALD Cycle | Mass gain of Pd compound (ng/cm$^2$) | Mass gain of alumina (ng/cm$^2$) | Total Mass gain (ng/cm$^2$) |
|---|---|---|---|
| 1 | 51.51 | 33.02 | 84.53 |
| 2 | 18.36 | 26.44 | 44.80 |
| 3 | 11.93 | 25.07 | 37.00 |
| 4 | 10.55 | 22.26 | 32.81 |
| 5 | 9.18 | 22.48 | 31.66 |
| 6 | 10.55 | 22.46 | 33.01 |
| 7 | 9.18 | 22.46 | 31.64 |
| 8 | 7.94 | 23.70 | 31.64 |
| 9 | 9.18 | 25.08 | 34.26 |
| 10 | 7.94 | 23.83 | 31.77 |
| 11 | 7.81 | 23.84 | 31.65 |
| 12 | 10.55 | 23.70 | 34.25 |
| 13 | 10.55 | 23.83 | 34.38 |
| 14 | 10.55 | 25.08 | 35.63 |
| 15 | 11.78 | 23.83 | 35.61 |
| 16 | 10.55 | 25.07 | 35.62 |
| 17 | 10.55 | 23.71 | 34.26 |
| 18 | 10.55 | 23.83 | 34.38 |
| 19 | 10.55 | 25.07 | 35.62 |
| 20 | 9.18 | 26.45 | 35.63 |
| 21 | 10.55 | 25.07 | 35.62 |
| 22 | 9.18 | 25.07 | 34.25 |
| 23 | 10.55 | 25.08 | 35.63 |
| 24 | 10.68 | 26.30 | 36.98 |
| 25 | 10.55 | 25.07 | 35.62 |
| 26 | 10.56 | 25.07 | 35.63 |
| 27 | 10.55 | 25.07 | 35.62 |
| 28 | 9.31 | 26.30 | 35.61 |
| 29 | 9.34 | 26.42 | 35.76 |
| 30 | 9.18 | 26.44 | 35.62 |
| 31 | 10.56 | 25.07 | 35.63 |
| 32 | 11.78 | 26.44 | 38.22 |
| 33 | 9.18 | 26.50 | 34.26 |
| 34 | 10.46 | 23.86 | 34.38 |

In Ex. 1 $Pd(C_5HF_6O_2)_2$ does not substantially react with either TMA or water. For the ALD cycles, TMA and water react to form another layer of the oxide support surface. Table 1 suggests the oxide support surface area available for deposition prior to an ALD cycle is greater than the oxide support surface area available for deposition in subsequent ALD cycles. The data of Table 1 corresponding to ALD cycles 1 and 2 suggests this greater oxide support surface area through relatively greater mass gains for both the Pd compound and alumina. Following the mass gains that can be associated with the greater oxide support surface areas available for deposition, Table 1 shows that the Pd compound mass gain, the alumina mass gain, and the total mass gain are substantially constant for each ALD cycle. This constant growth rate is observed for ALD cycle 3 through ALD cycle 34, where the Pd compound mass gain has a mean of 10.05 ng/cm$^2$ with a standard deviation of 1.05 ng/cm$^2$, the alumina mass gain has a mean of 24.67 ng/cm$^2$ with a standard deviation of 1.28 ng/cm$^2$, and the total mass gain has a mean of 34.68 ng/cm$^2$ with a standard deviation of 1.69 ng/cm$^2$ per ALD cycle. Table 1 shows the composite has a mass gain of 30 ng to 90 ng per square centimeter of oxide support surface for each of the plurality of atomic layer deposition cycles and the composite has a palladium content by weight percent growth up to 12 percent for each of the plurality of atomic layer deposition cycles.

Ex. 2

Replicate Ex. 1 with changes. TTIP replaces TMA, TTIP and ultrapure water exposures are 4 s, and the surface is coated at 110° C. to produce an approximately 3.5 nanometer (nm) thick titania coating. Sequentially expose the coated surface to fifty ALD cycles at 110° C.

Table 2 shows the Pd compound ($Pd(C_5HF_6O_2)$), the titania, and the total mass gains for particular ALD cycles.

TABLE 2

| ALD Cycle | Mass gain of Pd compound (ng/cm$^2$) | Mass gain of titania (ng/cm$^2$) | Total Mass gain (ng/cm$^2$) |
|---|---|---|---|
| 1 | 22.47 | 15.90 | 38.37 |
| 2 | 13.15 | 5.34 | 18.49 |
| 3 | 7.81 | 6.71 | 14.52 |
| 4 | 5.21 | 7.95 | 13.16 |
| 5 | 3.97 | 6.58 | 10.55 |
| 6 | 2.60 | 6.58 | 9.18 |
| 7 | 3.97 | 21.10 | 25.07 |
| 8 | 3.97 | 5.34 | 9.31 |
| 9 | 3.98 | 7.94 | 11.92 |
| 10 | 2.60 | 6.58 | 9.18 |
| 11 | 1.37 | 6.58 | 7.95 |
| 12 | 2.60 | 6.58 | 9.18 |
| 13 | 2.60 | 3.97 | 6.57 |
| 14 | 3.97 | 5.34 | 9.31 |
| 15 | 2.60 | 6.58 | 9.18 |
| 16 | 2.60 | 6.71 | 9.31 |
| 17 | 2.60 | 3.97 | 6.57 |
| 18 | 0.84 | 14.92 | 15.76 |
| 19 | 1.37 | 3.94 | 5.31 |
| 20 | 2.63 | 6.58 | 9.21 |
| 21 | 1.38 | 6.58 | 7.96 |
| 22 | 2.59 | 10.56 | 13.15 |
| 23 | 2.74 | 6.58 | 9.32 |
| 24 | 2.60 | 6.58 | 9.18 |
| 25 | 1.37 | 6.58 | 7.95 |
| 26 | 2.60 | 6.71 | 9.31 |
| 27 | 2.60 | 6.58 | 9.18 |
| 28 | 2.60 | 6.58 | 9.18 |
| 29 | 1.37 | 6.58 | 7.95 |
| 30 | 2.60 | 6.72 | 9.32 |
| 31 | 1.22 | 6.58 | 7.80 |
| 32 | 2.75 | 6.58 | 9.33 |
| 33 | 1.22 | 6.72 | 7.94 |
| 34 | 2.60 | 6.58 | 9.18 |
| 35 | 2.60 | 6.58 | 9.18 |
| 36 | 2.74 | 6.58 | 9.32 |
| 37 | 1.37 | 6.58 | 7.95 |
| 38 | 2.60 | 6.58 | 9.18 |
| 39 | 2.60 | 5.34 | 7.94 |
| 40 | 2.60 | 6.58 | 9.18 |
| 41 | 2.75 | 6.58 | 9.33 |
| 42 | 2.60 | 6.56 | 9.16 |
| 43 | 1.38 | 7.94 | 9.32 |
| 44 | 1.24 | 7.94 | 9.18 |
| 45 | 2.60 | 5.34 | 7.94 |
| 46 | 2.60 | 6.58 | 9.18 |
| 47 | 2.74 | 6.58 | 9.32 |
| 48 | 1.24 | 7.94 | 9.18 |
| 49 | 1.37 | 7.94 | 9.31 |
| 50 | 1.24 | 5.34 | 6.58 |

In Ex. 2 $Pd(C_5HF_6O_2)_2$ does not substantially react with either TTIP or water. For the ALD cycles, TTIP and water react to form another layer of the oxide support surface. As suggested by Table 2, the oxide support surface area available for deposition prior to an ALD cycle is greater than the oxide support surface area available for deposition in subsequent ALD cycles. The data of Table 2 corresponding to ALD cycle 1 suggests this greater oxide support surface area through relatively greater mass gains for both the Pd compound and titania. Following the mass gains that can be associated with the greater oxide support surface areas available for deposition, Table 2 shows that the Pd compound mass gain, the titania mass gain, and the total mass gain are substantially constant for each ALD cycle. This constant growth rate is observed for ALD cycle 5 through ALD cycle 50, with ALD cycles 7, 18, and 22 omitted, where the Pd compound mass gain has a mean of 2.36 ng/cm$^2$ with a standard deviation of 0.79 ng/cm$^2$, the titania mass gain has a mean of 6.42 ng/cm$^2$ with a standard deviation of 0.93 ng/cm$^2$, and the total mass gain has a mean of 8.78 ng/cm$^2$ with a standard deviation of 1.11 ng/cm$^2$ per ALD cycle. Table 2 shows the composite has a mass gain of 6 ng to 40 ng per square centimeter of oxide support surface for each of the plurality of atomic layer deposition cycles.

Because the alumina mass gain for each ALD cycle, as seen in Ex. 1, is greater than the titania mass gain for each ALD cycle, as seen in Ex. 2, the Pd compound mass gain for each ALD cycle in Ex. 1 is greater than the Pd compound mass gain for each ALD cycle in Ex. 2. The greater alumina mass gains provide correspondingly greater oxide support surface area for Pd compound deposition.

Ex. 3

Load three hundred milligrams (mg) of silica gel onto a powder holder and hold in the ALD system at 177° C. for 30 minutes. Sequentially expose the silica gel to TMA and ultrapure water at 177° C. for ten cycles to produce an approximately 1 nanometer (nm) thick alumina coating. Each cycle includes a 50 second (s) TMA exposure, and a 150 s for ultrapure water exposure, and follow each exposure by a 200 s inert gas purge.

Sequentially expose the coated silica gel to Pd(C$_5$HF$_6$O$_2$)$_2$, TMA, and ultrapure water at 80° C. for 4 or 15 ALD cycles. Each ALD cycle includes a 300 s Pd(C$_5$HF$_6$O$_2$)$_2$ exposure, a 50 s TMA exposure, and a 300 s ultrapure water exposure, and follow each exposure by a 300 s inert gas purge.

Figure 2:
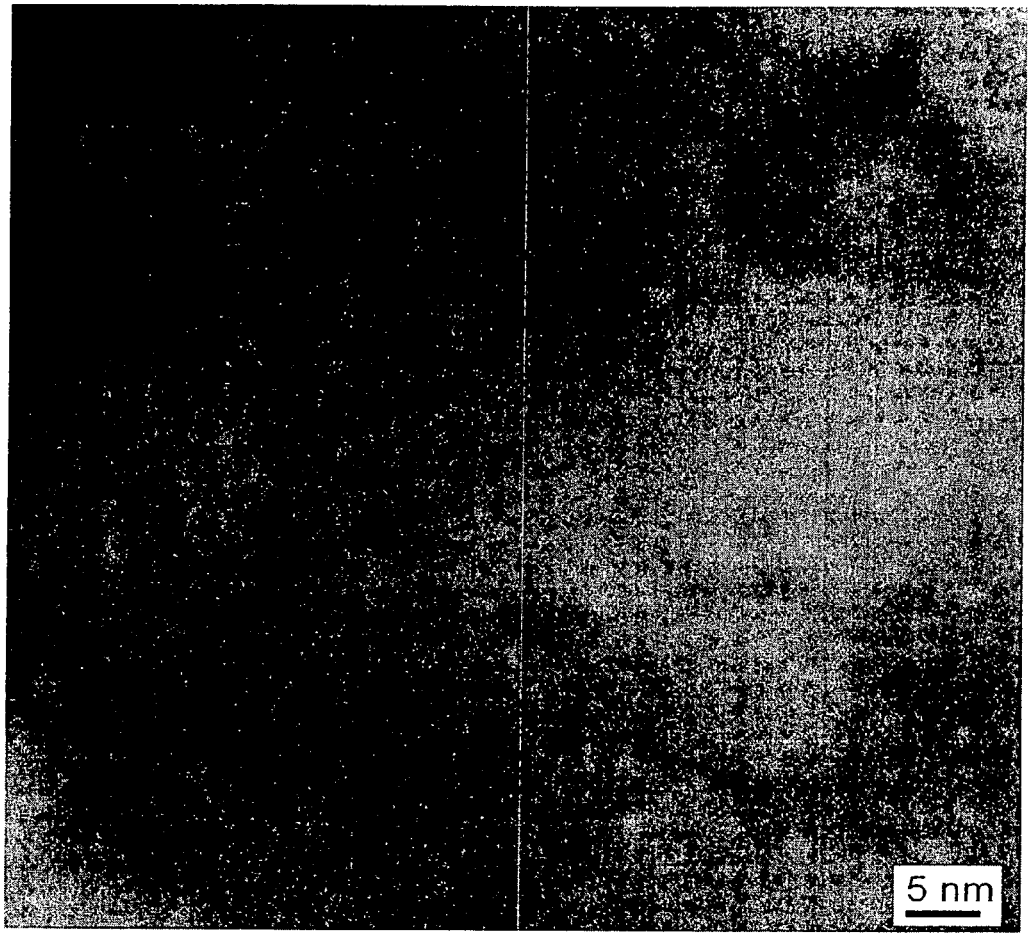
FIG. 2 illustrates palladium particles deposited on oxide support surface for 4 Example (Ex.) 3 ALD cycles.
Figure 3:
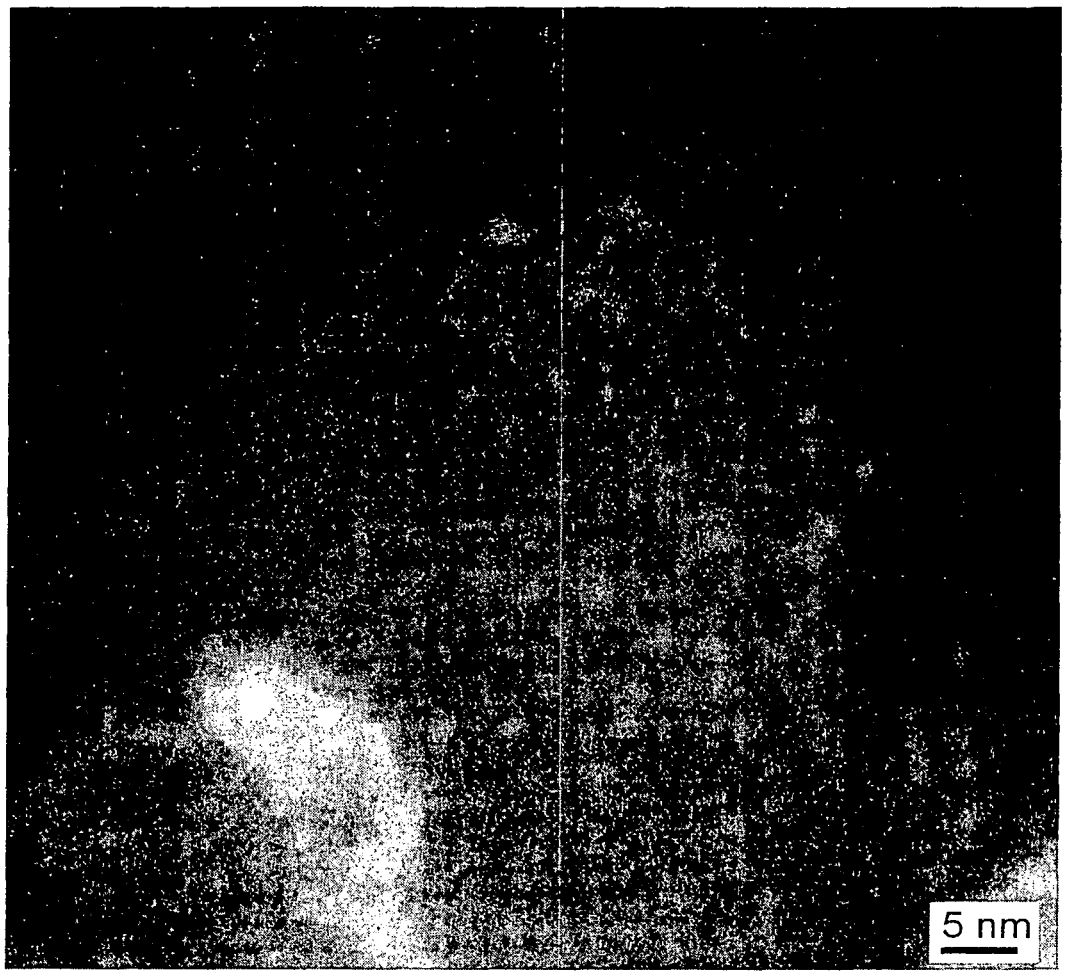
FIG. 3 illustrates palladium particles deposited on oxide support surface for 15 Ex. 3 ALD cycles.
Figure 4:
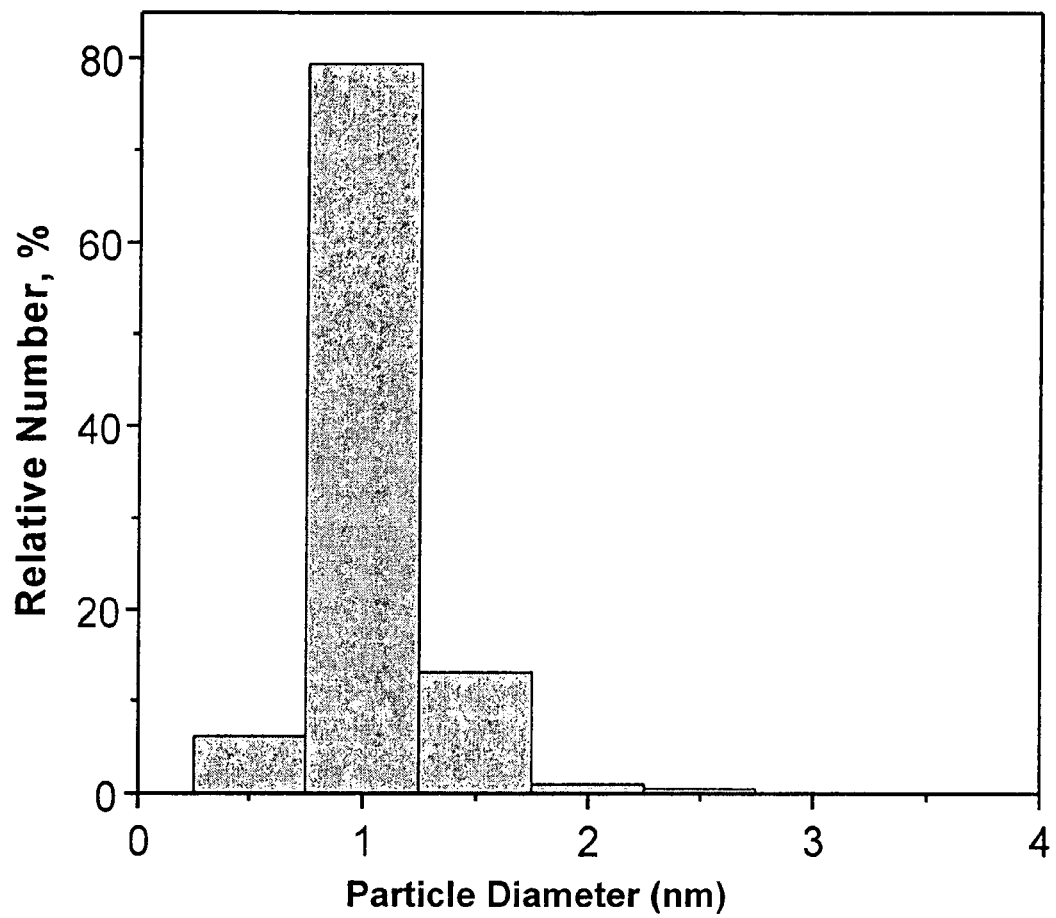
FIG. 4 illustrates a particle size histogram for Ex. 3.

Varying the plurality of ALD cycles from 4 to 15 results in varying the density of palladium particles deposited on the oxide support surface. More ALD cycles result in a relatively increased palladium density as seen in FIGS. 2-3, obtained with a JEOL® 2100F STEM. FIGS. 2 and 3 result from the four and fifteenth ALD cycles of Ex. 3, respectively and show that deposited palladium particles have a size in the range of 0.25 nanometer (nm) to 2.50 nm, with an average particle size of 1 nm. FIG. 4 is histogram of the size of 199 palladium particles deposited through fifteen Ex. 3 ALD cycles. FIG. 4 illustrates that 80 percent of the deposited palladium particles have a particle size within 0.2 nm of the average particle size of 1 nm.

Ex. 4

Figure 5:
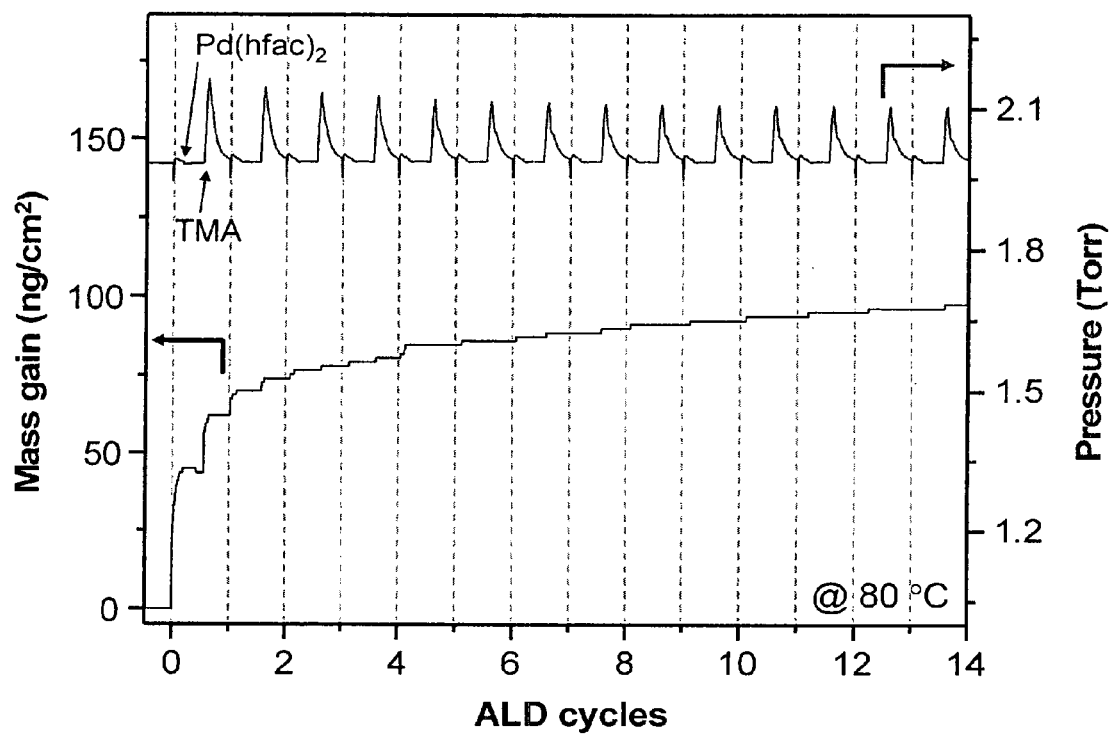
FIG. 5 illustrates cumulative mass gain and reactor pressure for ALD cycles of Ex. 4.

Replicate Ex. 1 with changes. Sequentially expose the coated surface to 14 cycles including Pd(C$_5$HF$_6$O$_2$)$_2$, and TMA at 80° C. Each cycle includes a 5 s Pd(C$_5$HF$_6$O$_2$)$_2$ exposure, and a 2 s TMA exposure, and follow each exposure by a 10 s inert gas purge. FIG. 5 shows Ex. 4 cumulative mass gain and reactor pressure. FIG. 5 indicates that the gain is mostly from alumina, caused by TMA reacting with trace amounts of water that is likely condensed in the reactor operated at a temperature lower than 100° C. FIG. 5 indicates there is substantially no reaction between Pd(C$_5$HF$_6$O$_2$)$_2$, and TMA at 80° C. FIG. 5 dashed lines indicate there is substantially no Pd mass gain with the Pd(C$_5$HF$_6$O$_2$)$_2$ doses. Ex 4 shows TMA is inert to Pd(C$_5$HF$_6$O$_2$)$_2$.

Ex. 5

Figure 6:
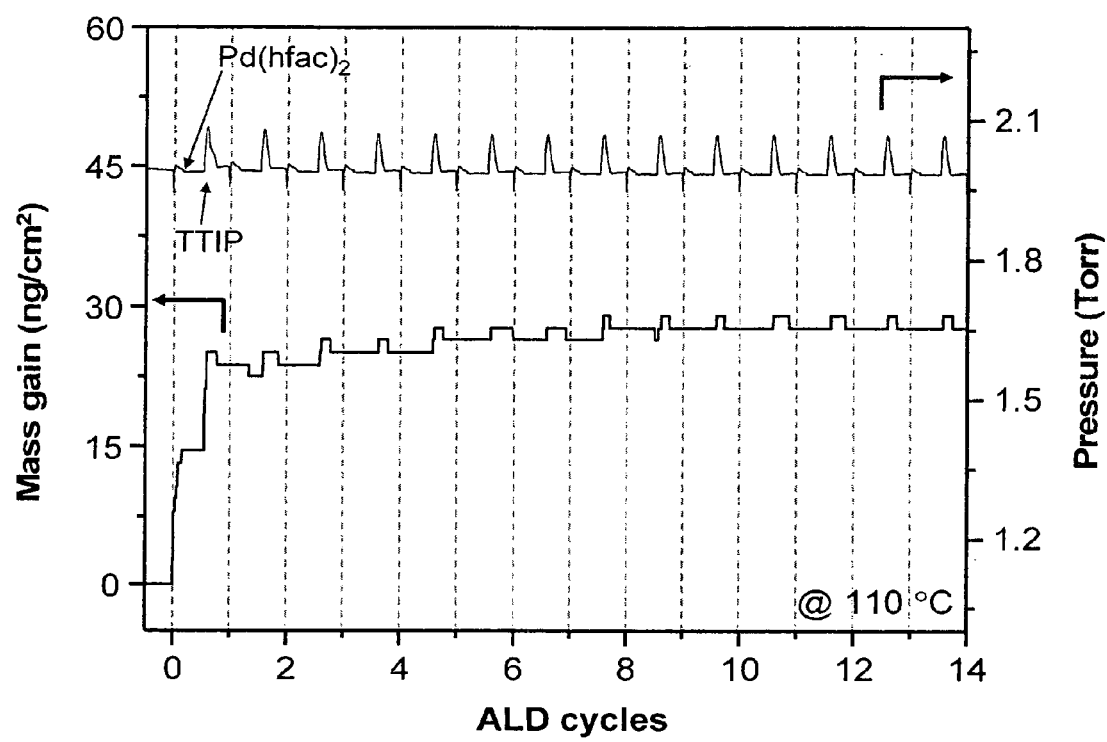
FIG. 6 illustrates cumulative mass gain and reactor pressure for ALD cycles of Ex. 5.

Replicate Ex. 2 with changes. Sequentially expose the coated surface to 14 cycles including Pd(C$_5$HF$_6$O$_2$)$_2$ and TTIP at 110° C. Each cycle includes a 5 s Pd(C$_5$HF$_6$O$_2$)$_2$ exposure, and a 2 s TTIP exposure, and follow each exposure by a 10 s inert gas purge. FIG. 6 shows Ex. 5 cumulative mass gains and reactor pressure. FIG. 6 indicates a negligible gain for the cycles. FIG. 6 indicates there is substantially no reaction between Pd(C$_5$HF$_6$O$_2$)$_2$, and TTIP at 110° C. FIG. 6 dashed lines indicate there is substantially no Pd mass gain with the Pd(C$_5$HF$_6$O$_2$)$_2$ doses. Ex 5 shows TTIP is inert to Pd(C$_5$HF$_6$O$_2$)$_2$.

What is claimed:

1. A method of forming a metal containing composite comprising:
    performing a plurality of atomic layer deposition cycles to form the metal containing composite, wherein one or more of the atomic layer deposition cycles include sequentially;
        contacting an oxide support surface with coordination compounds having metal atoms for a first predetermined time;
        contacting the oxide support surface with a first reagent that is inert to the coordination compounds for a second predetermined time;
        contacting the first reagent with a second reagent that is inert to the coordination compounds for a third predetermined time, where the first reagent and the second reagent react at a temperature within a range of from 20° C. to 300° C. to form another layer of the oxide support surface; and
        contacting the another layer of the oxide support surface with coordination compounds having metal atoms for a fourth predetermined time.

2. The method of claim 1, where the metal atoms are selected from the group consisting of palladium, platinum, rhodium, iridium, ruthenium, rhenium, gold, silver, copper, and combinations thereof.

3. The method of claim 1, where the first reagent is selected from the group consisting of Al(R$^1$)$_3$, Ti(R$^2$)$_4$, bis(cyclopentadienyl) magnesium, iron(III) tert-butoxide, Zn(R$^3$)$_2$, and combinations thereof, where each R$^1$ is independently methyl, ethyl, propyl, or hydroxide, each R$^2$ is independently ethoxide, iso-propxide, chloride, iodide, or benzyl, and each R$^3$ is independently ethyl, propyl, butyl, pentyl, hexyl, methoxide, or ethoxide.

4. The method of claim 1, where the second reagent is selected from the group consisting of water, ethylene glycol, formalin, ammonia, hydrogen sulfide, hydrogen peroxide, nitrous oxide, nitrogen dioxide, phosphine, arsine, and combinations thereof.

5. The method of claim 1, where the oxide support surface is selected from the group consisting of aluminum oxide, titanium dioxide, silicon dioxide, niobium oxide, copper oxide, iron oxide, zinc oxide, cerium oxide, magnesium oxide, zirconium oxide, and combinations thereof.

6. The method of claim 1, further including calcining the metal containing composite at a temperature within a range of from 80° C. to 450° C. in the presence of a non-reducing gas selected from the group consisting of helium, nitrogen, argon, neon, oxygen, ozone, dry air, and a combination thereof, and reducing the metal containing composite at a temperature within a range of from 80° C. to 600° C. in the presence of a reductant selected from the group consisting of hydrogen, hydrocarbons, carbon monoxide, formalin, and combinations thereof, where a plurality of metal particles have an average particle size of 1 nanometer (nm) and 80 percent of the metal particles have a particle size within 0.2 nm of the average particle size.

7. A metal containing composite obtainable by the method as claimed in claim 1, where metal particles of the metal containing composite have an average particle size of 1 nanometer (nm) and 80 percent of the metal particles have a particle size within 0.2 nm of the average particle size.

* * * * *